United States Patent

Lampman et al.

Patent Number: 5,497,089
Date of Patent: Mar. 5, 1996

[54] WIDE APERTURE GRADIENT SET

[75] Inventors: David A. Lampman, Eastlake; Michael A. Morich, Mentor; Labros Petropoulos, Cleveland Heights, all of Ohio

[73] Assignee: Picker International, Inc., Highland Heights, Ohio

[21] Appl. No.: 213,099

[22] Filed: Mar. 15, 1994

[51] Int. Cl.$^6$ .................................................. G01V 3/14
[52] U.S. Cl. ................................. 324/318; 324/322
[58] Field of Search ............................. 324/318, 319, 324/320, 322

[56] References Cited

U.S. PATENT DOCUMENTS

| | | | |
|---|---|---|---|
| 4,758,813 | 7/1988 | Holsinger et al. | 335/306 |
| 4,878,023 | 10/1989 | Overweg et al. | 324/318 |
| 5,177,442 | 1/1993 | Roemer | 324/318 |
| 5,185,576 | 2/1993 | Varek et al. | 324/318 |
| 5,185,577 | 2/1993 | Minemura | 324/318 |
| 5,278,504 | 1/1994 | Patrick | 324/318 |
| 5,378,989 | 1/1995 | Barber | 324/318 |

FOREIGN PATENT DOCUMENTS 304126  6/1995  European Pat. Off. .

OTHER PUBLICATIONS

"Compact Magnet and Gradient System for Breast Imaging", Pissanetzky, et al., SMRM 12th Annual Meeting, p. 1304 (1993).

"High-Order, Multi-Dimensional Design of Distributed Surface Gradient Coil", Oh, et al., SMRM 12th Annual Meeting, p. 1310.

"NMR Imaging in Biomedicine, Supplement 2," Mansfield, et al., pp. 268–269 (1982).

Primary Examiner—Sandra L. O'Shea
Assistant Examiner—Mack Haynes
Attorney, Agent, or Firm—Fay, Sharpe, Beall, Fagan, Minnich & McKee

[57] ABSTRACT

An insertable coil (40) is inserted in a bore (12) of a magnetic resonance imaging apparatus. Primary field magnets (10) create a temporally constant magnetic field longitudinally through the insertable coil. A computer control (58) controls a radio frequency coil (44) and a gradient coil (42) to create magnetic resonance imaging sequences and process received magnetic resonance signals into image representations. The insertable gradient coil includes a central cylindrical portion (60) having a first circumference. A second portion (62) disposed toward a patient receiving end of the insertable coil has a second circumference which is larger than the first circumference. In this manner, the first, smaller circumferential portion is adapted to receive the patient's head and the larger circumferential portion is adapted to accommodate the patient's shoulders. For symmetry which eliminates magnetic field induced torques, a service end (68) matches and is symmetric to the patient end (62). The z-gradient coil windings (FIG. 3), and x and y-gradient coil windings (FIGS. 4 or 5) are mounted such that a portion of the windings are on the first, smaller circumferential portion and a portion of the windings are on the larger patient and service end portions.

19 Claims, 4 Drawing Sheets

WIDE APERTURE GRADIENT SET

BACKGROUND OF THE INVENTION

The present invention relates to the magnetic resonance imaging art. It finds particular application in conjunction with insertable gradient coils for high speed imaging techniques and will be described with particular reference thereto.

Magnetic resonance imagers commonly include a large diameter, whole body gradient coil which surrounds a patient receiving bore. Main field magnets, either superconducting or resistive, and radio frequency transmission/reception coils also surround the bore. Although the whole body gradient coils produce excellent linear magnetic field gradients, they have several drawbacks. With large diameter gradient coils, the slew rate is sufficiently slow that it is a limiting factor on the rate at which gradient magnetic fields can be induced and changed. Large diameter whole body gradient coils are too slow for some of the highest speed magnetic resonance imaging techniques. The energy stored in gradient coils is generally proportional to greater than the fifth power of the radius. Hence, large diameter, whole body coils require large amounts of energy. Further, superconducting main magnets have cold shields disposed around the bore. The larger the diameter of the gradient coil, the closer it is to the cold shields and hence the more apt it is to produce eddy currents. More shielding is needed to prevent the whole body gradient coils from inducing eddy currents in the cold shields than would be necessary for smaller diameter coils.

Due to these and other limitations in whole body coils, numerous insertable coils have been developed which are small enough to fit within the bore with the patient. Typically, the insertable coils are customized to a specific region of the body, such as a head coil. Traditionally, head coils have been a cylinder sized to accommodate the human head easily, e.g. 28 cm in diameter. Most brain examinations center around the portion of the brain that is substantially in the same plane as the eye sockets. In a symmetric coil, the magnetic isocenter is configured to be disposed in a common plane with the patient's eyes. For a symmetric coil, the magnetic isocenter is at the physical center of the coil.

As a general rule, the longer the cylindrical head coil, the larger the region over which the gradient is linear and the more linear the region is. However, the patient's shoulders are a limiting factor on the length of a symmetric gradient coil. The shoulders limit the isocenter to about 20 cm at the patient end. Thus, symmetric head coils have heretofore been limited to about 40 cm in length.

In order to achieve the beneficial effects of a longer head coil, head coils have been designed in which the magnetic isocenter is offset toward the patient from the physical geometric center of the coil. See, for example, U.S. Pat. No. 5,278,504 of Patrick, et al. or U.S. Pat. No. 5,177,442 of Roemer, et al. Although asymmetric head coils have beneficial effects on the linearity and the size of the linear region, the improvement is not without an offsetting difficulty. In the main magnetic field, the asymmetric gradient coil is subject to mechanical torques from the magnetic field interactions. In order to counteract these torques, the asymmetric head coils are mounted with rigid mechanical constraints. Even with substantial mechanical structures anchored to the main field magnet assembly, the torque still tends to cause at least mechanical vibration and noise. Adding additional windings to produce a counteracting torque commonly increases the electrical power requirements by about 50% or more.

Although conventional head gradient coils include a Maxwell pair for the z-axis or Golay saddle coils for the x or y-axes on the surface of a cylinder, others have proposed coils in which all windings do not lie on the cylinder surface. "Compact Magnet and Gradient System For Breast Imaging", S. Pissanetzky, et al., SMRM 12th Annual Meeting, p. 1304 (1993) illustrates a compact asymmetric cylinder coil bent up radially at a 90° angle at the field producing end of the coil. The coil is designed for breast imaging with the coil pressed up against the chest. "High-Order, Multi-Dimensional Design of Distributed Surface Gradient Coil", Oh et al., SMRM 12th Annual Meeting, p. 310 (1993) attempts to optimize a gradient surface coil using current flows in three dimensions. One of the problems with the Oh surface gradient coil is that it was difficult to control linearity. Further, the coil was difficult to manufacture due to its complicated shape and high current densities.

The present invention provides a new and improved insertable gradient coil which overcomes the above-referenced problems and others.

SUMMARY OF THE INVENTION

In accordance with the present invention, an insertable gradient coil is provided. Gradient magnetic field inducing windings adjacent the magnetic isocenter are of a first, smaller radius dimensioned to receive the head or other selected anatomical portion of the patient. Adjacent at least the patient end of the coil, the windings extend along a second, larger radius.

In accordance with a more limited aspect of the present invention, the insertable gradient coil includes at least two rings of bunched windings of the first, smaller radius. The bunched windings are connected with return paths which extend along the second, larger radius.

In accordance with another more limited aspect of the present invention, the gradient coils include a plurality of thumbprint windings. The thumbprint windings have the first, smaller radius adjacent the isocenter and are flared to the second, larger radius adjacent at least the patient end of the coil.

In accordance with another more limited aspect of the present invention, the coil is symmetric such that windings of the second, larger radius are disposed adjacent both the patient end of the coil and an opposite service end of the coil.

In accordance with another aspect of the present invention, the coil is of elliptical cross-section.

One advantage of the present invention is that it achieves better linearity by allowing an increase in length.

Another advantage of the present invention is that it provides better access for positioning the patient inside the coil.

Other advantages of the present invention include higher peak gradients and faster rise times.

Another advantage of the present invention is that it permits faster data acquisition and higher gradient frequencies.

Yet another advantage of the present invention is that it avoids excessive current density, particularly along patient and service ends of the coil.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
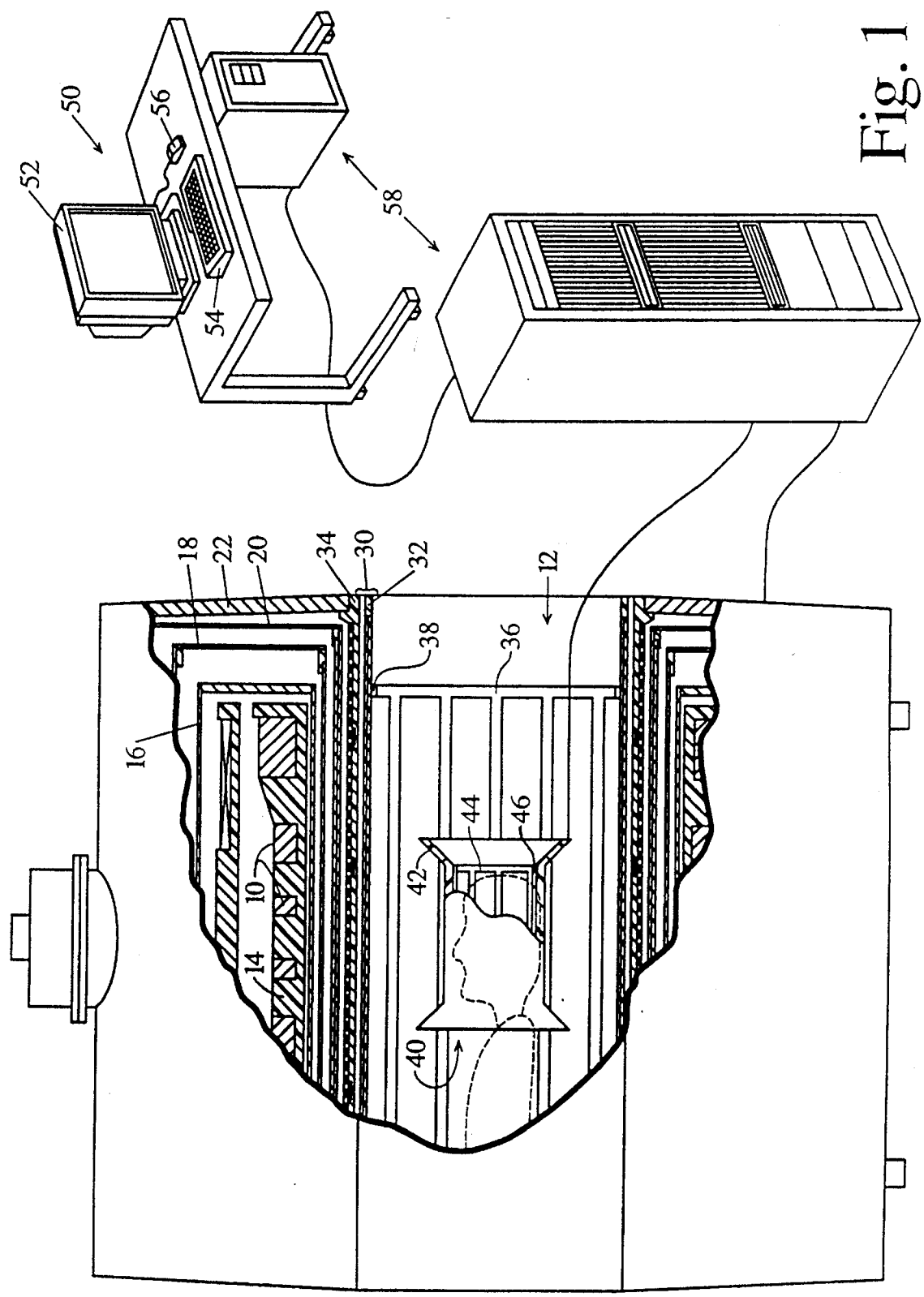
FIG. 1 is a diagrammatic illustration of a magnetic resonance imaging system including an insertable coil in accordance with the present invention.

With reference to FIG. 1, a plurality of primary magnet coils 10 generate a temporally constant magnetic field along a longitudinal or z-axis of a central bore 12. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by a series of cold shields 18, 20 which are supported in a vacuum dewar 22.

A whole body gradient coil assembly 30 includes x, y, and z-coils mounted along the bore 12. Preferably, the gradient coil assembly is a self-shielded gradient coil assembly that includes primary x, y, and z-coil assemblies potted in a dielectric former 32 and a secondary gradient coil assembly 34 that is supported on a bore defining cylinder of the vacuum dewar 22. A whole body RF coil 36 is mounted inside the gradient coil assembly 30. A whole body RF shield 38, e.g. copper mesh, is mounted between RF coil 36 and the gradient coil assembly 34.

An insertable gradient coil 40 is removably mounted in the center of the bore 12. The insertable coil assembly includes an insertable gradient coil assembly 42 supported by a dielectric former. An insertable RF coil 44 is mounted inside the dielectric former. An RF shield 46 is mounted between the insertable RF and gradient coils.

An operator interface and control station 50 includes a human-readable display such as a video monitor 52 and an operator input means including a keyboard 54 and a mouse 56. A computer control and reconstruction module 58 includes computer hardware and software for controlling the radio frequency coils 36 and 44 and the gradient coils 30 and 42 to implement any of a multiplicity of conventional magnetic resonance imaging sequences, including echo-planar imaging sequences. Echo-planar imaging sequences are characterized by short repetition rates and low flip angles. The processor 58 also includes a digital transmitter for providing RF excitation and resonance manipulation signals to the RF coil and a digital receiver for receiving and demodulating magnetic resonance signals. An array processor and associated software reconstruct the received magnetic resonance signals into an image representation which is stored in computer memory or on disk. A video processor selectively extracts portions of the stored reconstructed image representation and formats the data for display by the video monitor 52.

Figure 2:
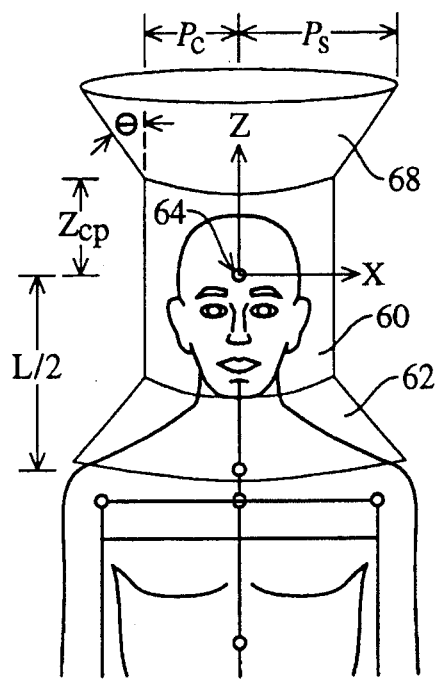
FIG. 2 is a diagrammatic illustration of a head coil in accordance with the present invention in relation to a human patient.

With reference to FIG. 2, the active gradient coil windings of the insertable gradient coil assembly 42 in the preferred embodiment are confined to a first cylindrical surface region 60 and an open patient end conical surface 62. The cylindrical surface 60 has an isocenter 64 mid-way, a distance $z_{cp}$ from either edge of the cylindrical surface. The cylindrical surface has an interior dimension sized to receive the human head, preferably with a radius $\rho_c$ equal to about 15 cm. The RF screen and RF head coil reside inside of this diameter, between the subject's head and the gradient. The conical section 62 and a matching service end conical portion 68 flare from the radius $\rho_c$ to a larger radius $\rho_s$.

This geometric shape for the gradient coil is symmetric, hence has an overall torque equal to zero. The imaging volume of the coil, i.e. the region with the best linearity and uniformity covers the entire human head and is centered on the brain. Due to the symmetry of the current density of the coil, its stored magnetic energy is less than the corresponding stored energy in an asymmetric gradient coil with the same specifications. The extended return path along the conical section permits lower turns densities.

To select the current winding pattern on a coil of this configuration, a sine Fourier-series expansion is performed. For the design of an axial or z-gradient coil, the current density is azimuthally oriented and varies only along the axial direction of the coil $J_\phi(z)$. As suggested by R. Turner, "Minimum Inductance Coils", J. Phys. E. Sci. Instrum. Vol 21, p. 948–952 (1988), expressing the z-component of the magnetic field $B_z$ and the stored magnetic energy W in terms of the current density, the function E is defined as:

$$E(j_n^a) = W - \sum_{j=1}^{N} \lambda_j(B_z(\vec{r_j}) - B_{zSC}(\vec{r_j})), \tag{1}$$

where $\lambda_j$ are the Lagrangian multipliers and $B_{zSC}$ represents the constraint values of the z-component of the magnetic field at N specified points. Minimizing E, a quadratic function of the current with respect to the current coefficients $j_n^a$, one obtains a matrix equation which $j_n^a$ must satisfy:

$$\sum_{n'=1}^{\infty} j_{n'}^a \left\{ aL\pi \int_{-\infty}^{\infty} dk I_1(ka) K_1(ka) \psi_n(k) \psi_{n'}(k) \right\} = \tag{2}$$

$$- \sum_{j=1}^{N} \lambda_j \int_{-\infty}^{\infty} dk k \sin k z_j I_0(k\rho_j) K_1(kaA) \psi_N(K),$$

where the evaluation of the Lagrangian multipliers is done via the constraint equation. Inverting Equation (2), one can solve for $j_n^a$, hence the current density. In these equations, a is the coil base radius and L is the coil length.

For manufacturability, the continuous current density is discretized. First, the continuous current distribution is divided into positive and negative current regions. Integrating the area of each region gives the amount of the total current contained in each region. Once the current for all regions of the cylinder is calculated, discrete current loops are placed in order to mimic the behavior of the continuous current pattern. Each region is then filled with discrete wires carrying a preselected amount of current which is the same for all discretized regions. The decision of the common amount of current for each loop is determined by considering the module of the current from all regions. In this case, the discrete coils can closely approximate the continuous current density. Specifically, each region of the continuous current density is divided into smaller segments which correspond to an equal amount of current. Then each wire is placed in the middle point of the segment in order to obtain an equal distribution from both sides of the segment when the magnetic field is calculated. In order to produce a current distribution which is confined to the cylindrical surface, a cut-off point in the axial direction is chosen at the distance $z_{cp}$ from the isocenter. With this point as the origin, the remaining end section of the cylindrical surface is tilted by an angle $\theta$ relative to the z-axis to form a conical surface. The relationship between the tilting angle $\theta$ and the axial, radial dimensions of the coil is:

$$\theta = \tan^{-1} \frac{\rho_s - \rho_c}{L/2 - z_{cp}} . \tag{1}$$

Figure 3:
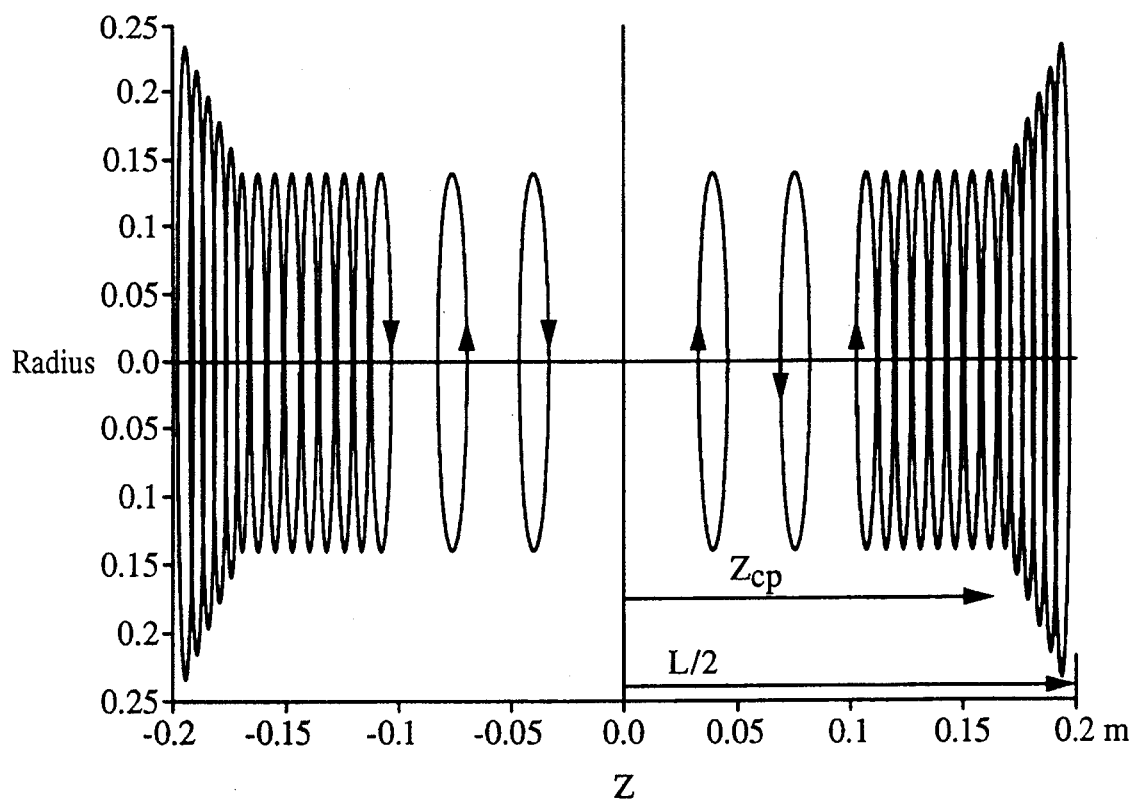
FIG. 3 is a diagrammatic illustration of a z-gradient winding for the head coil of FIG. 2.

Because the rotation is a unitary transformation, no alterations to the coordinate system and its unit vector result. In this manner, a discrete current pattern for the axial z-coil which is confined to a 3D surface which is a combination of a cylindrical surface up to point $z_{cp}$ and a conical surface for the rest of the coil length as illustrated in FIG. 3 is provided.

Figure 4:
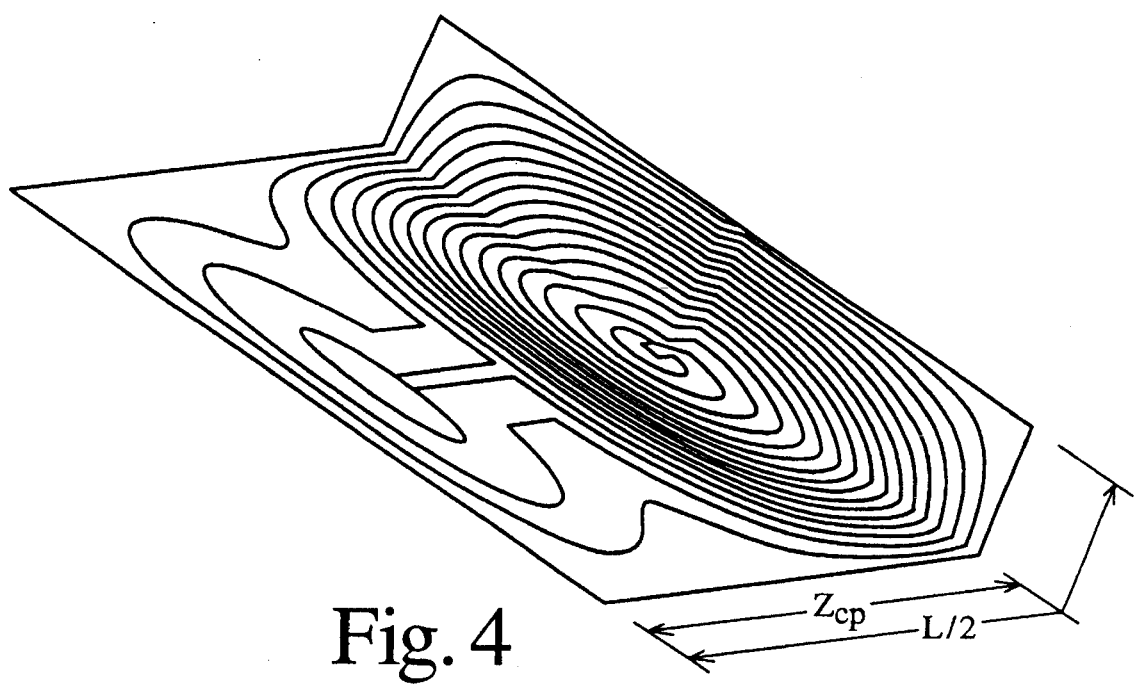
FIG. 4 is a diagrammatic illustration of one quadrant of an x or y-gradient fingerprint type winding for the gradient coil of FIG. 3 laid out flat.

With reference to FIG. 4, the x or y-gradient coils start with the configuration of a traditional finite size x or y-gradient coil with radius $\rho_c$ and total length L. The design of this type of gradient coil generates a gradient field which is odd-symmetric in the x or y-direction around the geometric center of the coil, respectively, while it is even-symmetric along the z and other of the x and y-directions, respectively. Due to the finite length of the gradient coil, a Fourier-series expansion in terms of the sine and cosine series is performed. Due to the symmetric conditions along the z-direction, only cosine Fourier-series expansion is needed. Due to the prespecified symmetric conditions, the current density lies on the surface of the cylinder and the resultant current density is constructed as a vector addition of two components—one along the axial direction $J_z(\phi,z)$ and the other along the azimuthal direction $J_\phi(\phi,z)$. Using the continuity equation in order to relate both components to the current density and expressing the z-component of the magnetic field $B_z$ and the stored energy W in terms of either one of these two components of the current density, the function E is again constructed as follows:

$$E(j_n^a) = W - \sum_{j=1}^{N} \lambda_j (B_z(\vec{r_j}) - B_{zSC}(\vec{r_j})), \tag{4}$$

where $\lambda_j$ are the Lagrangian multipliers and $B_{zSC}$ represent the constraint values of the z-component of the magnetic field at N specified points. Minimizing E, a quadratic function of current, with respect to the current density coefficients $j_n^a$, one obtains a matrix equation which $j_n^a$ must satisfy:

$$\sum_{n'=1}^{\infty} j_{n'}^a \left\{ \frac{aL\pi}{2} \int_{-\infty}^{\infty} dk I_1'(ka) K_1'(ka) \psi_n(k) \psi_{n'}(k) \right\} = \tag{5}$$

-continued $$\sum_{j=1}^{N} \lambda_j \cos(\phi_j) \int_{-\infty}^{\infty} dk k \cos k z_j I_1(k\rho_j) K_1'(ka),$$

where the evaluation of the Lagrangian multipliers can be done via the constraint equation. Inverting Equation (5), a solution for $j_n^a$ and hence the current density is obtained. Replacing this expression into the stored energy and magnetic field formulas, one acquires a final expression for the stored magnetic energy and the magnetic field in terms of the constraint points and the geometry of the system.

In order to obtain a discrete version of the above continuous current density, consider the continuity equation for the current density:

$$\vec{\nabla} \cdot \vec{J} = 0 \tag{6}.$$

In analogy with the magnetic field where the vector potential is introduced, the current density can be expressed as a curl of the function $\vec{S}$, called a "stream function". Specifically:

$$\vec{J} = \vec{\nabla} \times \vec{S} \tag{7}.$$

Because the current is restricted to flow on the surface of a cylinder of radius a and has only angular and axial dependence, the relation between the current density and the stream function in cylindrical coordinates is:

$$j_\phi^a(\phi,z)\hat{\alpha}_\phi + j_z^a(\phi,z)\hat{\alpha}_z = -\frac{\partial S_p}{\partial z} \hat{\alpha}_\phi - \frac{1}{a} \frac{\partial S_p}{\partial \phi} \hat{\alpha}_z, \tag{8}$$

and $S_p$ is found from:

$$S_p(\phi,z) = -a \int_{-\pi}^{\phi} d\phi' j_z^a(\phi',z). \tag{9}$$

The contour plots of the current density are determined by:

$$S_p(\phi,z) = (n - \tfrac{1}{2}) S_{inc} + S_{min} \text{ for } n=1, \ldots, N \tag{10},$$

where N is the number of current contours, $S_{min}$ is the minimum value of the current density, and $S_{inc}$ represents the amount of the current between two contour lines. The determination of $S_{inc}$ is:

$$S_{inc} = \frac{S_{max} - S_{min}}{N}, \tag{11}$$

with $S_{max}$ representing the maximum value of the current density. The contours which are generated by this method follow the flow of the current and the distance between them corresponds to a current equal to an amount of $S_{inc}$ in amps. As illustrated in region $z_{cp}$ of FIG. 4, discrete wires are positioned in such a way as to coincide with these contour lines.

Looking now to the discrete current density portions which lie on the surface of the cone, a cut-off point along the axial direction is chosen at a distance $z_{cp}$ away from the geometric center. With this point as the origin, the remaining part of the cylindrical surface is tipped by an angle $\theta$ relative to the z-axis. The relationship between the tilting angle $\theta$ and the axial, radial dimensions of the coil is:

$$\theta = \tan^{-1} \frac{\rho_s - \rho_c}{L/2 - z_{cp}} . \tag{12}$$

Because the rotation is a unitary transform, no alterations in the coordinate system and the unit vectors are made. In this manner, a discrete coil pattern is generated for the transverse x or y-gradient coil which are defined in a 3D surface which is a combination of the cylindrical surface up to the point $z_{cp}$ and a conical surface for the rest of the coil length.

To evaluate the magnetic field of the discrete current distribution, one uses the Biot-Savart law:

$$B_z = \frac{\mu_0 I}{4\pi} \int_{l_1}^{l_2} \frac{(\vec{dl} \times (\vec{r} - \vec{r}'))_z}{|\vec{r} - \vec{r}'|^3} . \tag{13}$$

The evaluation of Equation (13) can be separated into two integration areas. The first integration area includes only the region of the cylindrical surface in which $\rho = \rho_c$. Thus, each current segment is only a function of the azimuthal direction $\phi$ and the axial direction z. The expression of the magnetic field which results from this current pattern is:

$$B_z = \frac{\mu_0 I}{4\pi} \int_{\phi_1}^{\phi_2} d\phi' \Bigg\{ \frac{\rho_c^2 - \rho\rho_c\cos(\phi - \phi')}{[\rho_c^2 + \rho^2 - 2\rho\rho_c\cos(\phi - \phi') + (z \pm z')^2]^{3/2}} + \frac{\rho_c^2 - \rho\rho_c\cos(\phi + \phi')}{[\rho_c^2 + \rho^2 - 2\rho\rho_c\cos(\phi + \phi') + (z \pm z')^2]^{3/2}} - \frac{\rho_c^2 + \rho\rho_c\cos(\phi - \phi')}{[\rho_c^2 + \rho^2 + 2\rho\rho_c\cos(\phi - \phi') + (z \pm z')^2]^{3/2}} - \frac{\rho_c^2 + \rho\rho_c\cos(\phi + \phi')}{[\rho_c^2 + \rho^2 + 2\rho\rho_c\cos(\phi + \phi') + (z \pm z')^2]^{3/2}} \Bigg\}, \tag{14}$$

where $$z' = z_1 + \frac{z_2 - z_1}{\phi_2 - \phi_1} (\phi' - \phi_1), \tag{15}$$

with $z_1$, $\phi_1$ representing the coordinates of the origin for each line segment at the discrete current distribution, and $z_2$, $\phi_2$ corresponding to the coordinates of the end point for the same line segment.

In the second region, each point of the discrete current pattern is a function of three variables ($\rho$, $\phi$, z). Due to the cone, there is variation along the azimuthal direction $\phi$, the axial direction z, and an additional dependence on the radial variation $\rho$. The expression of the z-component of the magnetic field for this portion of the equation becomes:

$$B_z = \frac{\mu_0 I}{4\pi} \int_{\phi_1}^{\phi_2} d\phi' \Bigg\{ \frac{\rho S_\rho \sin(\phi - \phi') + \rho'^2 - \rho\rho'\cos(\phi - \phi')}{[\rho'^2 + \rho^2 - 2\rho\rho'\cos(\phi - \phi') + (z \pm z')^2]^{3/2}} + \frac{-\rho S_\rho \sin(\phi + \phi') + \rho'^2 - \rho\rho'\cos(\phi + \phi')}{[\rho'^2 + \rho^2 - 2\rho\rho'\cos(\phi + \phi') + (z \pm z')^2]^{3/2}} - \frac{\rho S_\rho \sin(\phi - \phi') - \rho'^2 - \rho\rho'\cos(\phi - \phi')}{[\rho'^2 + \rho^2 + 2\rho\rho'\cos(\phi - \phi') + (z \pm z')^2]^{3/2}} - \frac{-\rho S_\rho \sin(\phi + \phi') - \rho'^2 - \rho\rho'\cos(\phi + \phi')}{[\rho'^2 + \rho^2 + 2\rho\rho'\cos(\phi + \phi') + (z \pm z')^2]^{3/2}} \Bigg\}, \tag{16}$$

with:

$$\rho' = \rho_1 + S_\rho(\phi' - \phi_1), \tag{17a}$$

$$z' = z_1 + \frac{z_2 - z_1}{\phi_2 - \phi_1} (\phi' - \phi_1), \tag{17b}$$

$$S_\rho = \frac{\rho_2 - \rho_1}{\phi_2 - \phi_1}, \tag{17c}$$

where $\rho_1$, $\phi_1$, $z_1$ are corresponding coordinates of the origin of the line segment at the conical region and $\rho_2$, $\phi_2$, $z_2$ are corresponding coordinates of the end point for the same line segment. By employing the above steps, the discrete patterns of one quadrant of current distribution which is capable of generating 50 mT/m gradient strength over a 20 cm diameter spherical volume as shown in FIG. 4 is created.

Figure 5:
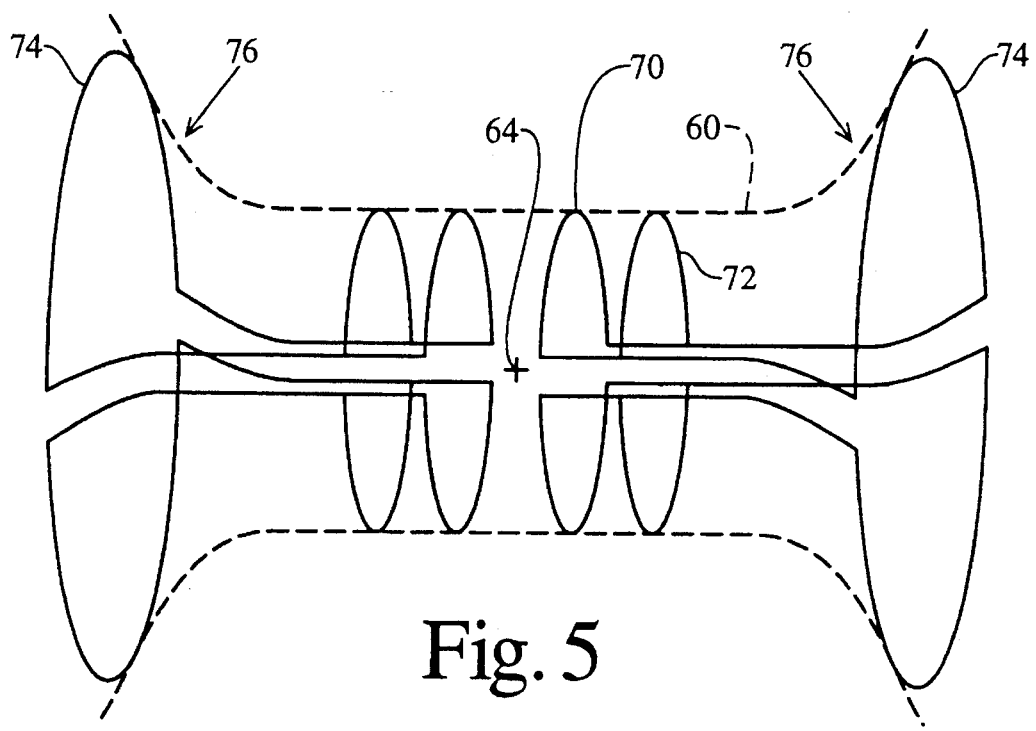
FIG. 5 is a diagrammatic illustration of a bunched x or y-gradient winding for the coil of FIG. 2.

Similar results can be achieved using a bunched, rather than distributed, x or y-gradient coil. With reference to FIG. 5, there are four, symmetric quadrants of bunched coiled windings which are symmetric relative to the isocenter 64. Each bunched winding includes a plurality of generally semi-circular windings 70 adjacent a central plane of the cylinder 60 and a second, larger set of bunched windings 72 more distant from the central plane and again lying along the central cylinder 60. Return windings 74 are mounted on either a conical or enlarged cylindrical region 76 of larger diameter than the cylinder 60.

Figure 6:
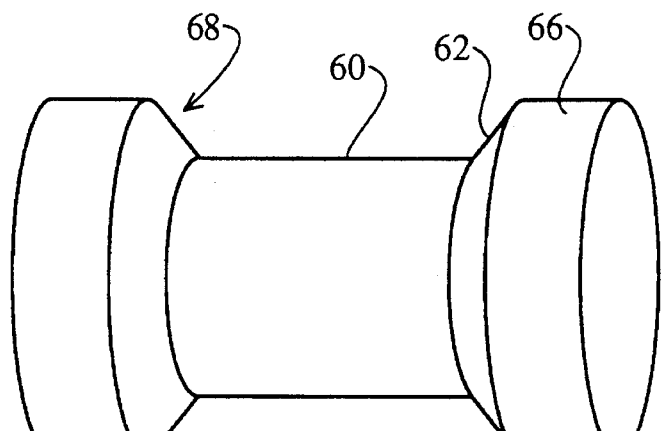
FIG. 6 is an alternate embodiment of the head coil of FIG. 2.

Various alternate embodiments are also contemplated. With reference to FIG. 6, the coil may again have a central cylindrical portion 60 sized to fit the subject's head or other anatomical portion. A flared region 62 connects the central cylindrical region with outer cylindrical regions 66 of larger diameter. In a head coil embodiment, the larger cylindrical region 66 is of sufficient dimension to receive the patient's shoulders therein. For symmetry purposes, matching flared regions and cylindrical regions are preferably provided on both the patient and the service end 68 of the head coil. As another alternative, the central cylinder 60 can be elliptical to follow the generally elliptical cross-section of the human head and the outer larger cylindrical portion 66 is elliptical in a direction to match the aspect ratio of the human shoulders.

Figure 7:
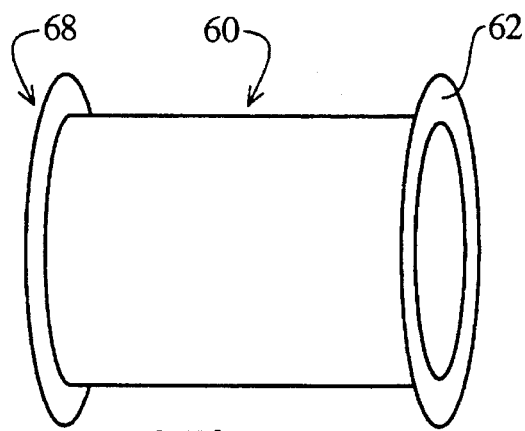
FIG. 7 is another alternate embodiment of the head coil of FIG. 2.

With reference to FIG. 7, the flared portion 62 may be at 90° to the central cylinder 60.

Figure 8:
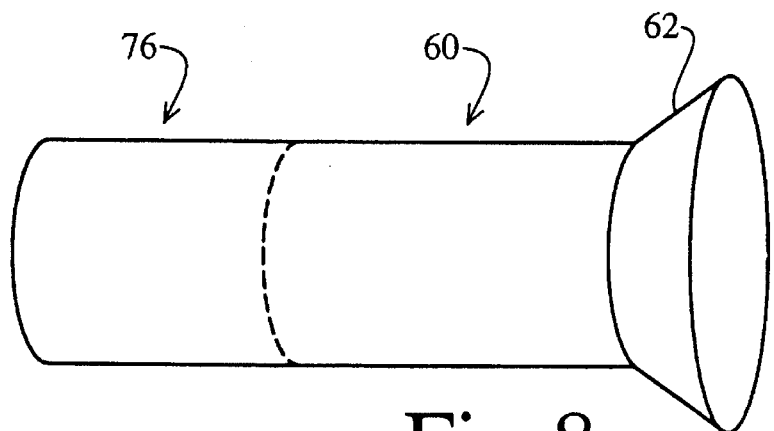
FIG. 8 is yet another alternate embodiment.

With reference to FIG. 8, the insertable gradient coil need not have flared or enlarged portions at both ends. Rather, the central region 60 can connect a flared or enlarged region 62 at the patient end and an extended region 76 on the service end. The region 76 may be flared or tapered to a different radius than the patient end 62 or may be the same radius as the central cylindrical portion 60.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In an insertable gradient coil for a magnetic resonance imaging apparatus, which insertable gradient coil includes a central cylindrical portion having an interior bore of a first cross-section dimensioned to receive a head of the subject to be imaged, the central cylindrical portion carrying gradient coil windings for creating linear magnetic field gradients in the interior bore through the subject's head, THE IMPROVEMENT COMPRISING:

the insertable gradient coil further including a first end portion of a second cross-section dimensioned to receive shoulders of the subject to be imaged, the second cross-section being larger than the first cross-section, the first end portion being connected with a first end of the central cylindrical portion adjacent a patient receiving end of the insertable gradient coil, the gradient coil windings extending in part along the first end portion such that the gradient coil windings lie in part on the central cylindrical portion and in part off the central cylindrical portion on the first end portion.

2. In the gradient coil of claim 1, THE IMPROVEMENT FURTHER COMPRISING:

gradient coil further including a second end portion of said second cross-section, the second end portion being connected with a second end of the central cylindrical portion adjacent a service end of the coil opposite to the patient receiving end of the coil, the gradient coil windings extending in part along the second end portion.

3. A gradient magnetic field coil assembly for a magnetic resonance imaging apparatus, the gradient field coil assembly comprising:

a central cylindrical region of a first circumference;

a first end region adjacent at least one end of the central region having a second circumference, the second circumference being larger than the first circumference;

a gradient coil for generating magnetic field gradients within the smaller circumference portion, the gradient coil having windings on both the smaller circumference central region and the larger circumference first end region.

4. The gradient coil assembly as set forth in claim 3 further including a second end region disposed adjacent a second end of the central cylindrical region, the second end region having a circumference that is larger than said first circumference.

5. The gradient coil assembly as set forth in claim 3 wherein the gradient windings include an axial gradient winding extending circumferentially around the central cylindrical region with a plurality of turns and around the first end region with a further plurality of turns for generating gradient magnetic fields axially along the coil.

6. A gradient magnetic field coil assembly for a magnetic resonance imaging apparatus, the gradient field coil assembly comprising:

a central region of a first cross-section;

a first end region adjacent a first end of the central region, the first end region having a second circumference that is larger than the first circumference;

a set of four gradient windings for generating a magnetic field gradient component within the central region across a central axis thereof, at least two of the gradient windings being bunched coils which include arc segments extending along the central region and return paths extending along the first end region.

7. A gradient magnetic field coil assembly for a magnetic resonance imaging apparatus, the gradient field coil assembly comprising:

a first region extending around a longitudinal axis;

a second region extending around the longitudinal axis and being disposed adjacent at least one end of the first region, the second region being disposed further from the longitudinal axis than the first region;

a set of gradient coil windings for generating a magnetic field gradient across the longitudinal axis, the winding set including at least first and second distributed coil windings each with its windings extending in generally a thumbprint pattern, the first and second distributed coil winding each having their thumbprint pattern disposed in part on the first region and in part on the second region.

8. A gradient magnetic field coil assembly for a magnetic resonance imaging apparatus, the gradient field coil assembly comprising:

a central cylindrical region of a first, smaller circumference;

an end region adjacent at least one end of the central region having a second, larger circumference, the second circumference being larger than the first circumference;

the smaller circumference central cylindrical region and the larger circumferential end region both being circularly symmetric;

a gradient coil for generating magnetic field gradients within the smaller circumferential central cylindrical portion, the gradient field coil having windings on both the smaller circumferential central cylindrical region and the larger circumferential end region.

9. The gradient coil assembly as set forth in claim 3 wherein the larger circumferential end region includes a flared portion which angles outward from the smaller diameter central region along an open, generally conical segment.

10. The gradient coil assembly as set forth in claim 3 wherein the larger circumferential end region includes a cylindrical portion.

11. A magnetic resonance imaging system comprising:

a primary magnetic field assembly for generating a temporally constant magnetic field through a central bore thereof;

a whole body gradient coil assembly disposed around the central bore;

a radio frequency coil assembly disposed around the central bore;

a head coil removably mounted in the central bore, the head coil including:

a plurality of gradient coil windings which extend around a first cylindrical portion of a first circumference and around at least a second portion of a second circumference, which second circumference is larger than the first circumference, the second circumference portion being mounted to a patient receiving end of the head gradient coil, and an RF coil winding disposed within at least the first cylindrical portion;

a magnetic resonance excitation and reconstruction means for controlling the radio frequency and insertable gradient coils for inducing magnetic resonance within the first cylindrical portion and for receiving magnetic resonance signals therefrom and for reconstructing the received magnetic resonance signals into an image representation.

12. A magnetic resonance imaging system comprising:

a primary magnetic field assembly for generating a temporally constant magnetic field through a central bore thereof:

a whole body gradient coil assembly disposed around the central bore;

a radio frequency coil assembly disposed around the central bore;

a head coil removably mounted in the central bore, and head coil including:

a plurality of gradient coil windings disposed on (i) a first cylindrical portion having first and second ends, (ii) a second portion connected to the first cylindrical portion first end and being flared outward to a larger circumference than the first cylindrical portion, and (iii) a third portion connected to the second end of the first cylindrical portion and being flared outward to a larger circumference than the first cylindrical portion, the gradient coil windings being disposed symmetrically on the first, second, and third portions such interactions of the temporally constant magnetic field and electric current pulses in the gradient coil winding induce no net torque on the head coil, and an RF coil winding disposed within at least the first cylindrical portion;

a magnetic resonance excitation and reconstruction means for controlling the radio frequency and insertable gradient coils for inducing magnetic resonance within the first cylindrical portion and for receiving magnetic resonance signals therefrom and for reconstructing the received magnetic resonance signals into an image representation.

13. The magnetic resonance imaging system as set forth in claim 11 wherein the gradient coil windings of the head coil include axial gradient field windings which extend circumferentially around the first portion and the second portion with a plurality of turns for generating gradient magnetic fields axially along the head gradient coil.

14. The magnetic resonance imaging system as set forth in claim 11 wherein the head gradient coil windings include at least four bunched coils, at least two of the bunched coils each including arc segments extending circumferentially around the first portion and return paths extending along the second circumferential portion.

15. A magnetic resonance imaging system comprising:

a primary magnetic field assembly for generating a temporally constant magnetic field through a central bore thereof;

a whole body gradient coil assembly disposed around the central bore;

a radio frequency coil assembly disposed around the central bore;

head gradient coil removably mounted in the central bore, the head coil including:

at least four thumbprint pattern coil segments which extend at least in part around a cylindrical first portion of a first circumference, at least two of the thumbprint pattern coil segments each extending in part over about one quadrant of the first portion and each extending in part over a second portion of a second circumference, which second circumference is larger than the first circumference, the second circumference portion being mounted toward a patient receiving end of the head gradient coil, and an RF coil winding disposed within at least the first cylindrical portion;

a magnetic resonance excitation and reconstruction means for controlling the radio frequency and insertable gradient coils for inducing magnetic resonance within the first cylindrical portion and for receiving magnetic resonance signals therefrom and for reconstructing the received magnetic resonance signals into an image representation.

16. The magnetic resonance imaging system as set forth in claim 11 wherein the first portion and the second portion are both circularly symmetric.

17. The magnetic resonance imaging system as set forth in claim 11 wherein the second portion is flared outward from the first portion to define an open, generally conical segment.

18. A gradient coil set for a magnetic resonance imaging system, the gradient coil set comprising:

a gradient coil carrier including (i) a cylinder for defining an imaging region therein, the cylinder having a first end for receiving a patient and a second end and (ii) a flange attached to the first end;

at least two current-carrying continuous paths, each path having a plurality of turns, with each turn being partially disposed on the cylinder and partially on the flange;

a gradient coil power supply for supplying current pulses to the continuous paths for selectively creating a linear magnetic field gradient.

19. The gradient coil according to claim 18 further including:

a second flange attached to the second end of the cylinder; and at least two additional current-carrying continuous paths, each having a plurality of turns with each turn being disposed in part on the cylinder and in part on the second flange.

* * * * *